US005774086A

United States Patent [19]

Guyot

[11] Patent Number: 5,774,086

[45] Date of Patent: Jun. 30, 1998

[54] VOLTAGE AMPLIFIER HAVING A LARGE RANGE OF VARIATIONS, AND A/D CONVERTER COMPRISING SUCH AN AMPLIFIER

[75] Inventor: Benoît Guyot, Caen, France

[73] Assignee: U.S. Philips Corporation, New York, N.Y.

[21] Appl. No.: 755,667

[22] Filed: Nov. 25, 1996

[30] Foreign Application Priority Data

Nov. 29, 1995 [FR] France .................................. 95 14131

[51] Int. Cl.[6] .................................................. H03M 1/36

[52] U.S. Cl. .......................................................... 341/159

[58] Field of Search .................................... 341/159, 160, 341/143, 135, 136, 133; 330/258, 261

[56] References Cited

U.S. PATENT DOCUMENTS 4,904,952 2/1990 Tanimoto ................................ 330/252

5,557,238 9/1996 Weiss .................................... 330/258

FOREIGN PATENT DOCUMENTS

0312017A2 4/1989 European Pat. Off. .

4038217A1 6/1991 Germany .

*Primary Examiner*—Brian K. Young

*Attorney, Agent, or Firm*—Steven R. Biren

[57] ABSTRACT

A voltage amplifier AD comprising two transistors (Q1, Q2) arranged as a differential pair, having collectors which are connected to a positive power supply terminal (VCC) by means of two branches each comprising a resistive load. Each branch comprises at least two resistive elements (R11, R12, R21, R22) arranged in series. The amplifier AD is also provided with means for comparing the potentials of the different nodes of the circuit, which means allow addition of a first and a second current (IO, IO') to the current supplied in a portion of the resistive load of the second branch. These currents allow rectification of the non-linearity of the evolution of the output voltage (Vout) as a function of the input voltage (Vin).

20 Claims, 7 Drawing Sheets

AD
VCC
R11
R21
R12
R22
A
C
I0
I0'
10
11
GND
Vout
Q1
Q2
Vin
-Vin

VOLTAGE AMPLIFIER HAVING A LARGE RANGE OF VARIATIONS, AND A/D CONVERTER COMPRISING SUCH AN AMPLIFIER

BACKGROUND OF THE INVENTION

The invention relates to a voltage amplifier intended to receive an input voltage and to supply an output voltage, which voltage amplifier comprises an amplifier stage including a first and a second transistor arranged as a differential pair, the base of the first transistor being intended to receive the input voltage, the base of the second transistor being intended to receive a voltage opposed to said input voltage, the collector of the first transistor being connected to a positive power supply terminal by means of a first branch comprising a resistive load, the collector of the second transistor, intended to supply the output voltage, being connected to the positive power supply terminal by means of a second branch comprising a resistive load.

A voltage amplifier of this type is described in U.S. Pat. No. 4,904,952. This known voltage amplifier provides a strong voltage gain, while having a good frequency behaviour. However, it has been found that its transfer characteristic loses linearity in the neighbourhood of the limits of the range of variations of the output voltage. Moreover, as the number of transistor stages is minimally three between the two power supply potentials of the circuit, this range of variations is necessarily reduced, which presents a major drawback in "low-voltage" applications.

SUMMARY OF THE INVENTION

It is an object of the invention to remedy these drawbacks by proposing a voltage amplifier in which the linearity of the transfer characteristic is improved in the neighbourhood of the limits of the range of variations of the output voltage, while using a limited number of transistor stages between the two power supply potentials of the circuit.

According to the invention, a voltage amplifier of the type defined in the opening paragraph is characterized in that the first branch is constituted by at least two series-arranged resistive elements featuring at least a first intermediate node between the positive power supply terminal and the collector of the first transistor, in that the second branch is constituted by at least two series-arranged resistive elements featuring at least a second intermediate node between the positive power supply terminal and the collector of the second transistor, in that the voltage amplifier is provided with means for comparing the potential of the second intermediate node with that of the collector of the first transistor, on the one hand, and the potential of the first intermediate node with that of the collector of the second transistor, on the other hand, and for adding to the current supplied in a portion of the resistive load of the second branch, a first current which is progressively reduced to zero when the potential of the second intermediate node exceeds that of the collector of the first transistor, and a second current which is progressively reduced to zero when the potential of the collector of the second transistor exceeds that of the first intermediate node.

A particularly advantageous embodiment of the invention is a voltage amplifier which is characterized in that the means for comparing the potential of the second intermediate node with that of the collector of the first transistor, on the one hand, and the potential of the first intermediate node with that of the collector of the second transistor, on the other hand, respectively comprise a third and a fourth transistor arranged as a differential pair, and a fifth and a sixth transistor arranged as a differential pair, the base of the third transistor being connected to the second intermediate node and that of the fourth transistor being connected to the collector of the first transistor, the base of the fifth transistor being connected to the first intermediate node and that of the sixth transistor being connected to the collector of the second transistor, the collectors of the fourth and the fifth transistor being connected to the second intermediate node.

The additional differential pairs being arranged in parallel with the amplifier stage, the amplifier thus has a limited number of transistor stages between the two power supply terminals of the circuit, while the sum of the voltage drops at the terminals of the various transistors is consequently also limited, which renders the amplifier particularly suitable for "low-voltage" applications.

This voltage amplifier realizes a feedback loop, using the output voltage for purposes of comparison in order to render the evolution of said output voltage more linear. A variant of the invention allows control of the comparison thresholds without modifying the gain of the amplifier in a significant way.

Such a voltage amplifier is characterized in that the first branch is constituted by at least three series-arranged resistive elements featuring at least a first and a second intermediate node between the positive power supply terminal and the collector of the first transistor, in that the second branch is constituted by at least three series-arranged resistive elements featuring at least a third and a fourth intermediate node between the positive power supply terminal and the collector of the second transistor, in that the voltage amplifier is provided with means for comparing the potentials of the collector of the first transistor and the fourth intermediate node, on the one hand, and those of the collector of the second transistor and the second intermediate node, on the other hand, and for adding to the current supplied in a portion of the resistive load of the second branch, a first current which is progressively reduced to zero when the potential of the fourth intermediate node exceeds that of the collector of the first transistor, and a second current which is progressively reduced to zero when the potential of the collector of the second transistor exceeds that of the second intermediate node.

A preferred embodiment of the invention is a voltage amplifier which is characterized in that the means for comparing the potentials of the collector of the first transistor and the fourth intermediate node, on the one hand, and the potentials of the collector of the second transistor and the second intermediate node, on the other hand, respectively comprise a third and a fourth transistor arranged as a differential pair, and a fifth and a sixth transistor arranged as a differential pair, the base of the third transistor being connected to the fourth intermediate node and that of the fourth transistor being connected to the collector of the first transistor, the base of the fifth transistor being connected to the second intermediate node and that of the sixth transistor being connected to the collector of the second transistor, and the collectors of the fourth and the fifth transistor being connected to one of the intermediate nodes of the second branch.

In a variant of this embodiment, the voltage amplifier is also characterized in that the collectors of the fourth and the fifth transistor are connected to the third intermediate node.

The portion of the resistive load, in which the current(s) added by the additional differential pairs flow(s) in addition to the normal operating current of the amplifier stage, is thus limited, so that, in terms of voltage drop, the perturbations caused at the potentials of the intermediate nodes, whose values are used for said additional pairs, are also limited.

A variant of the voltage amplifier according to the invention is characterized in that the resistive elements between the first and second intermediate nodes, on the one hand, and between the third and fourth intermediate nodes, on the other hand, have the same value R, in that the resistive elements between the positive power supply terminal and the first intermediate node, on the one hand, and between the positive power supply terminal and the third intermediate node, on the other hand, have a same value which is smaller than R, and in that the resistive elements between the second intermediate node and the collector of the first transistor, on the one hand, and between the fourth intermediate node and the collector of the second transistor, on the other hand, have a same value which is smaller than R.

This choice of values of the resistive elements allows a better definition of the zones of the transfer characteristics where the non-linearity corrections are performed.

Another variant of the voltage amplifier according to the invention is characterized in that the resistive elements between the first and second intermediate nodes, on the one hand, and between the third and fourth intermediate nodes, on the other hand, have a same value R, in that the resistive elements between the positive power supply terminal and the first intermediate node and between the second intermediate node and the collector of the first transistor, as well as those between the positive power supply terminal and the third intermediate node and between the fourth intermediate node and the collector of the second transistor have a same value which is smaller than R.

An amplifier according to the invention not only has the advantage of a transfer characteristic with an improved linearity over a larger range of variations of the input voltage but also has the advantage of supplying a single, non-differential output signal which renders it particularly suitable for applications of the A/D conversion type where the output voltage of the amplifier is compared with a range of reference voltages which themselves are also non-differential.

The invention thus also relates to an A/D converter intended to receive an analog input voltage of a differential nature, to be converted into a digital output signal, comprising:

- an input amplifier intended to receive the analog input voltage, and to supply an analog output voltage,
- a resistance ladder arranged in series between a positive and a negative power supply terminal, in which the resistors are intended to supply a plurality of reference voltages at their intermediate nodes,
- a comparator stage in which each comparator is intended to perform a comparison between the output voltage of the input amplifier and one of the reference voltages;
- a memory stage intended to store the results of said comparisons, and
- a binary encoder intended to receive the information stored in the memory stage and to supply the digital output signal of the converter, characterized in that the input amplifier is an amplifier as described hereinbefore.

These and other aspects of the invention will be apparent from and elucidated with reference to the embodiments described hereinafter.

DETAILED DESCRIPTION OF THE PREFERRED EMBODIMENTS

Figure 1:
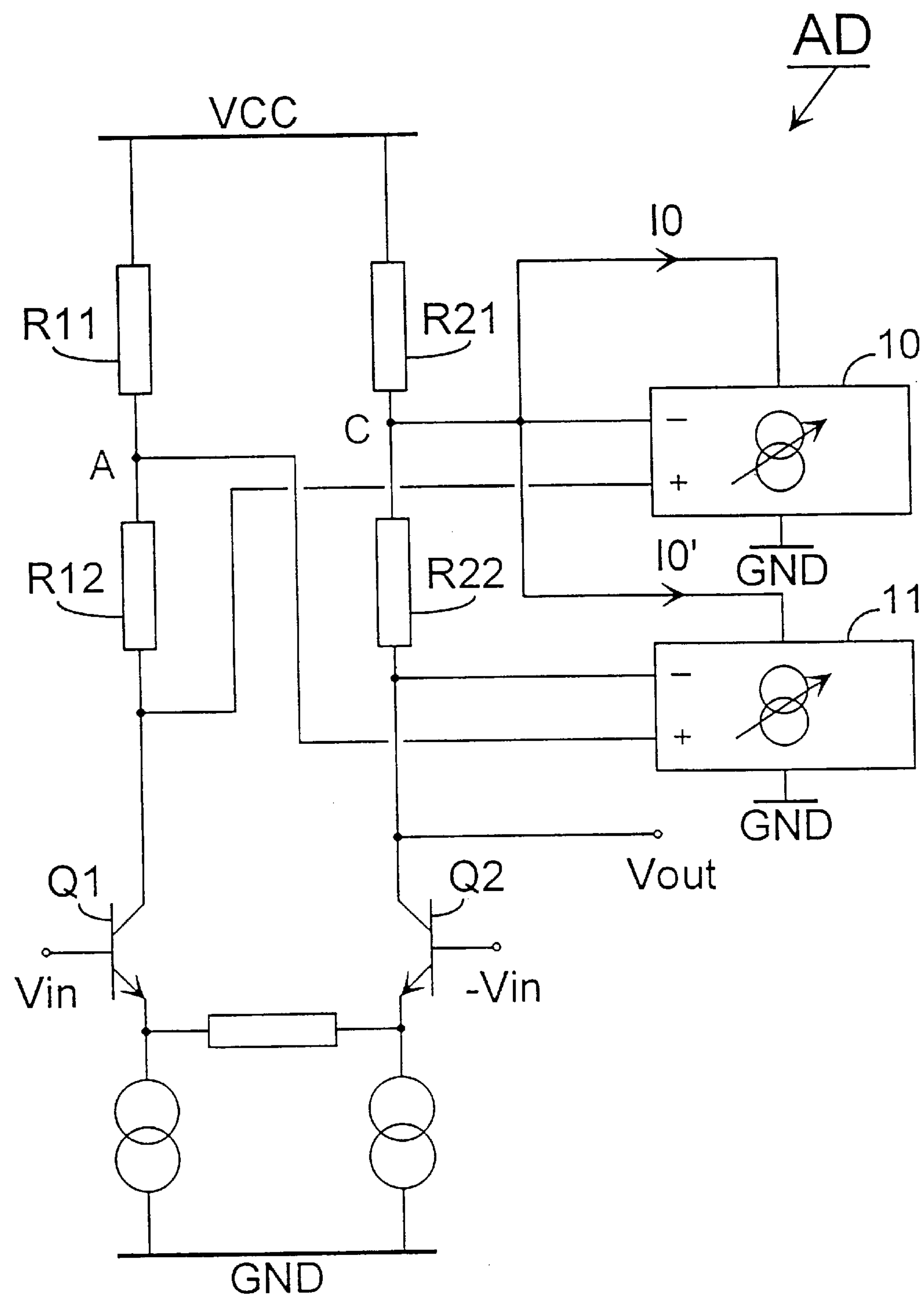
FIG. 1 is a partial functional circuit diagram of a voltage amplifier according to the invention.

FIG. 1 shows diagrammatically a voltage amplifier AD according to the invention. Two transistors Q1 and Q2 are arranged as a differential pair: the emitter of transistor Q1 is connected to one of the terminals of a resistor, while the emitter of transistor Q2 is connected to the other terminal of the same resistor. Each of the two emitters is connected to a terminal of a current source, while the other terminal of said current source is connected to a negative power supply terminal, referred to as GND. The base of transistor Ql receives the input voltage, referred to as Vin, of the voltage amplifier, while the base of transistor Q2 receives the opposite of said input voltage, referred to as −Vin. The collector of the first transistor Ql is connected to a positive power supply terminal, referred to as VCC, by means of a first branch comprising a resistive load, while the collector of the second transistor Q2, supplying the output voltage referred to as Vout, is connected to the positive power supply terminal VCC by means of a second branch comprising a resistive load. The first branch is formed by at least two resistive elements referred to as R 1l and R12 which are arranged in series and feature at least a first intermediate node referred to as A between the positive power supply terminal VCC and the collector of the first transistor Q1. The second branch is formed by at least two resistive elements referred to as R21 and R22 which are arranged in series and feature at least a second intermediate node referred to as C between the positive power supply terminal VCC and the collector of the second transistor Q2.

The voltage amplifier AD is provided with means 10 and 11 for comparing the potential of the second intermediate node C with that of the collector of the first transistor Ql, on the one hand, and the potential of the first intermediate node A with that of the collector of the second transistor Q2, on the other hand. These means allow addition, to the current supplied in a portion of the resistive load of the second branch, R21, of a first current IO which is progressively reduced to zero when the potential of the second intermediate node C exceeds that of the collector of the first transistor Ql, on the one hand, and of a second current 10'which is progressively reduced to zero when the potential of the collector of the second transistor Q2 exceeds that of the first intermediate node A.

Figure 2:
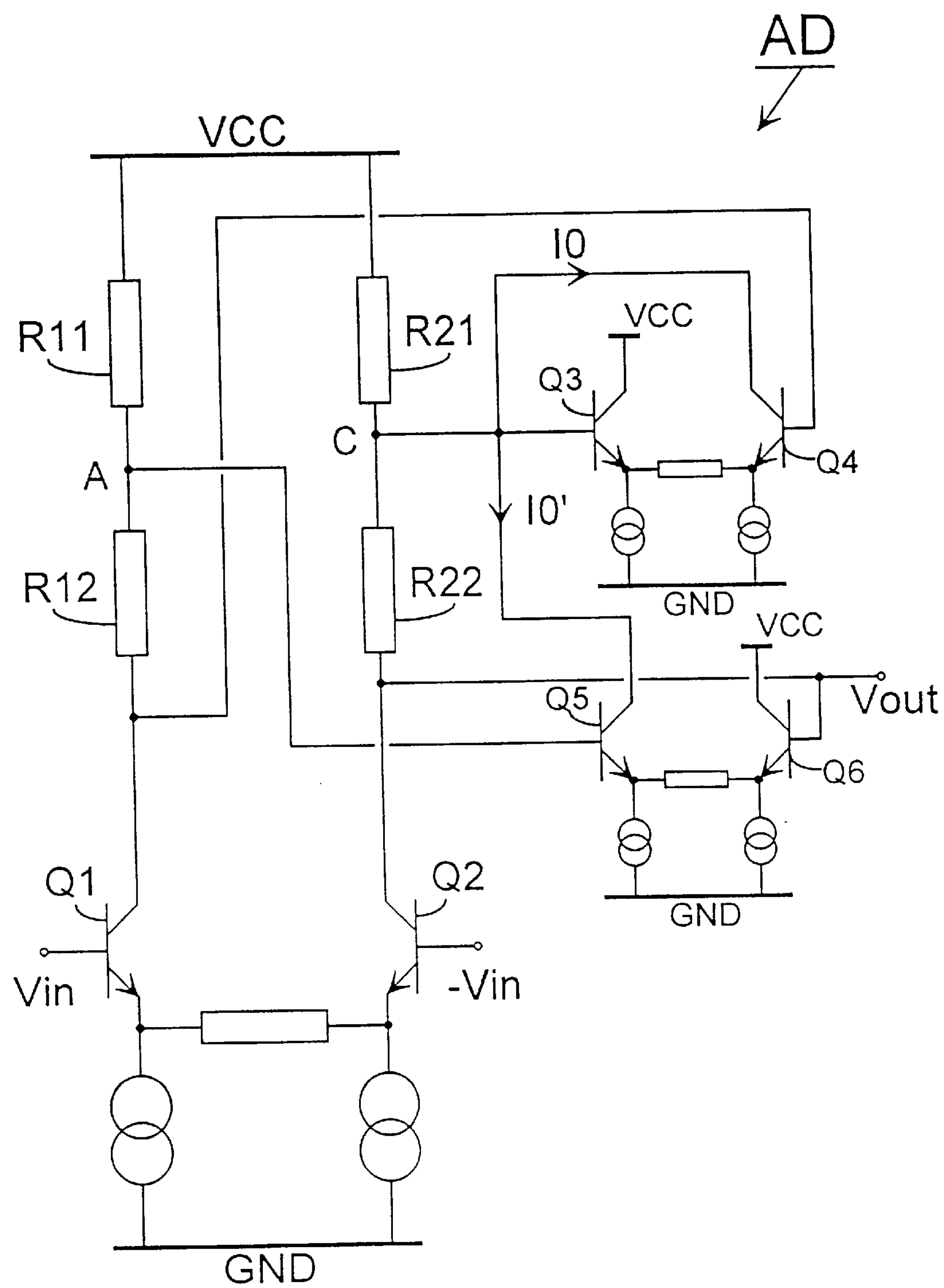
FIG. 2 is a partial functional circuit diagram of a voltage amplifier in accordance with an advantageous embodiment of the invention.

FIG. 2 shows diagrammatically a voltage amplifier AD in accordance with an advantageous embodiment of the invention. The structures of the amplifier stage and the branches comprising the resistive loads are identical to those described with reference to FIG. 1. An embodiment of means 10 and 11 is also shown: these means respectively comprise a third transistor Q3 and a fourth transistor Q4 arranged as a differential pair, and a fifth transistor Q5 and a sixth transistor Q6 arranged as a differential pair. The base of the third transistor Q3 is connected to the second intermediate node C and that of the fourth transistor Q4 is connected to the collector of the first transistor Qi, the base of the fifth transistor Q5 is connected to the first intermediate node A and that of the sixth transistor Q6 is connected to the collector of the second transistor Q2. The collectors of the third and the sixth transistor Q3 and Q6 are connected to the positive power supply terminal VCC and those of the fourth and the fifth transistor Q4 and Q5 are connected to the second intermediate node C.

Figure 3:
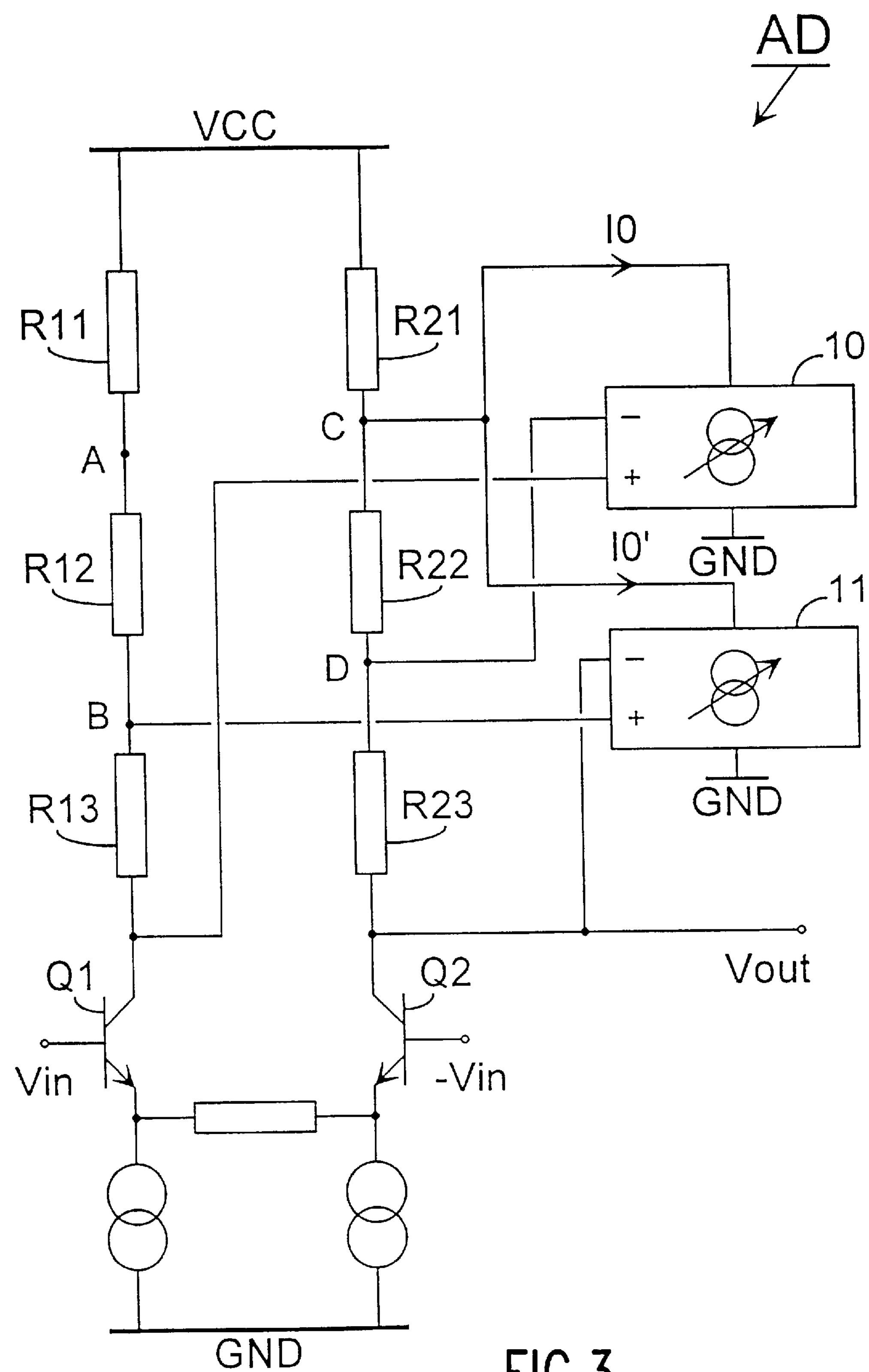
FIG. 3 is a partial functional circuit diagram of a voltage amplifier in accordance with a variant of the invention.

FIG. 3 shows diagrammatically a voltage amplifier AD in accordance with a variant of the invention. Two transistors Q1 and Q2 are arranged as a differential pair: the emitter of transistor Q1 is connected to one of the terminals of a resistor, while the emitter of transistor Q2 is connected to the other terminal of the same resistor. Each of the two emitters is connected to a terminal of a current source, while the other terminal of said current source is connected to a negative power supply terminal, referred to as GND. The base of transistor Q1 receives the input voltage, referred to as Vin, of the voltage amplifier, while the base of transistor Q2 receives the opposite of said input voltage, referred to as Vin. The collector of the first transistor Q1 is connected to a positive power supply terminal, referred to as VCC, by means of a first branch comprising a resistive load, while the collector of the second transistor Q2 supplying the output voltage referred to as Vout is connected to the positive power supply terminal VCC by means of a second branch comprising a resistive load. The first branch is formed by at least three resistive elements referred to as R11, R12 and R13 which are arranged in series and have at least a first and a second intermediate node referred to as A and B, respectively, between the positive power supply terminal VCC and the collector of the first transistor Q1. The second branch is formed by at least three resistive elements referred to as R21, R22 and R23 which are arranged in series and have their terminals coupled to at least a third and a fourth intermediate node referred to as C and D, respectively, between the positive power supply terminal VCC and the collector of the second transistor Q2.

The voltage amplifier AD is provided with means 10 for comparing the potentials of the collector of the first transistor Q1 and the fourth intermediate node D, referred to as VC1 and VD, respectively, on the one hand, and those of the collector of the second transistor Q2 and the second intermediate node B, referred to as VC2 and VB, respectively, on the other hand. The same means allow addition, to the current supplied in a portion of the resistive load of the second branch, R21, of a first current 10 which is progressively reduced to zero when the potential of the fourth intermediate node VD exceeds that of the collector of the first transistor VC1, and a second current IO' which is progressively reduced to zero when the potential of the collector of the second transistor VC2 exceeds that of the second intermediate node VB.

Figure 4:
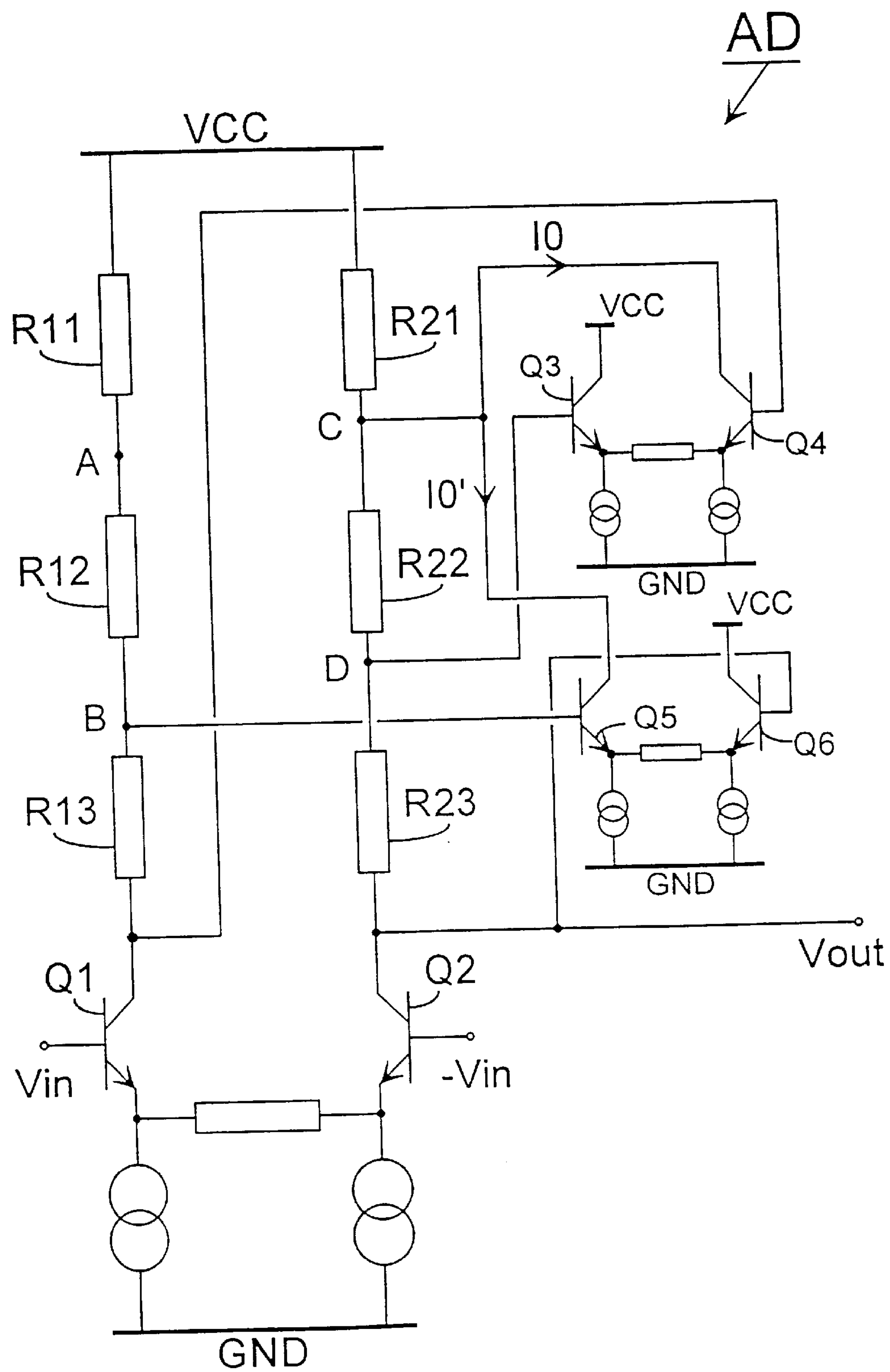
FIG. 4 is a partial functional circuit diagram of a voltage amplifier in accordance with a preferred embodiment of the invention.

FIG. 4 shows diagrammatically a voltage amplifier AD in accordance with a preferred embodiment of the invention. The structures of the amplifier stage and the branches comprising the resistive loads are identical to those described with reference to FIG. 3. An embodiment of means 10 and 11 is also shown: these means respectively comprise a third transistor Q3 and a fourth transistor Q4 arranged as a differential pair, and a fifth transistor Q5 and a sixth transistor Q6 arranged as a differential pair. The base of the third transistor Q3 is connected to the fourth intermediate node D and that of the fourth transistor Q4 is connected to the collector of the first transistor Q1, the base of the fifth transistor Q5 is connected to the second intermediate node B and that of the sixth transistor Q6 is connected to the collector of the second transistor Q2. The collectors of the third and the sixth transistor Q3 and Q6 are connected to the positive power supply terminal VCC and those of the fourth and the fifth transistor Q4 and Q5 are connected to one of the intermediate nodes of the second branch. In the embodiment described with reference to FIG. 4, the collectors of the fourth and the fifth transistor, Q4 and Q5, are connected to the third intermediate node C.

For better comprehension of the operation of amplifier AD, FIGS. 5 to 9 show the evolution of various signals within this amplifier as a function of its input voltage.

Figure 5:
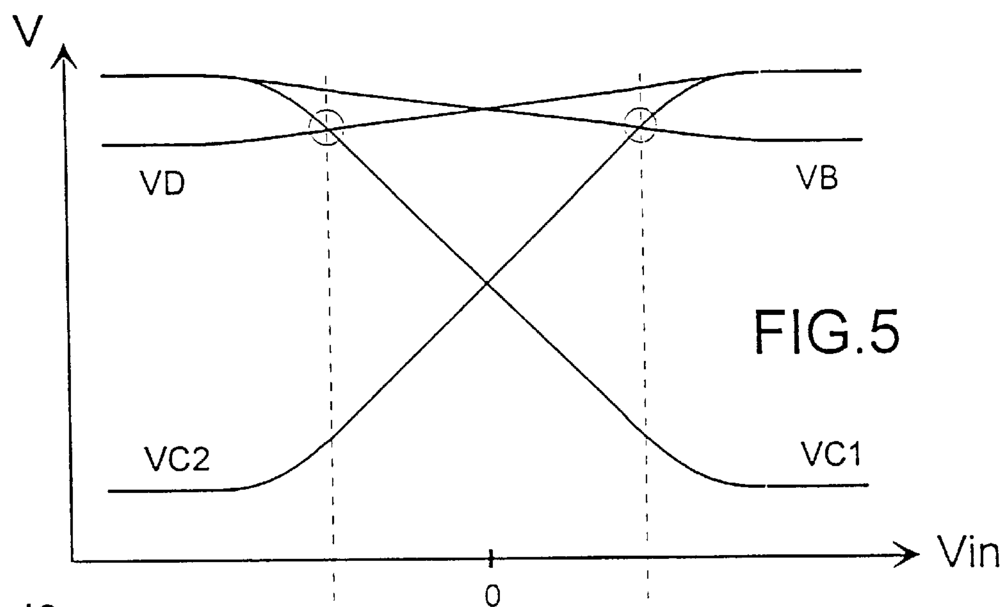
FIG. 5 is a set of characteristic curves describing the evolution of the potentials of the intermediate nodes as a function of the input voltage of the amplifier.
Figure 6:
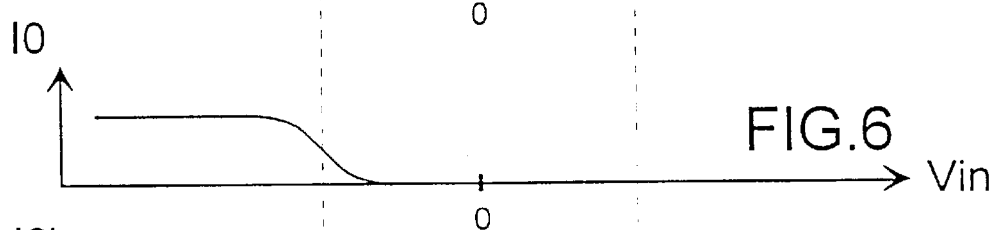
FIG. 6 is a characteristic curve describing the evolution of the first current added in a portion of the resistive load as a function of the input voltage of the amplifier.
Figure 7:
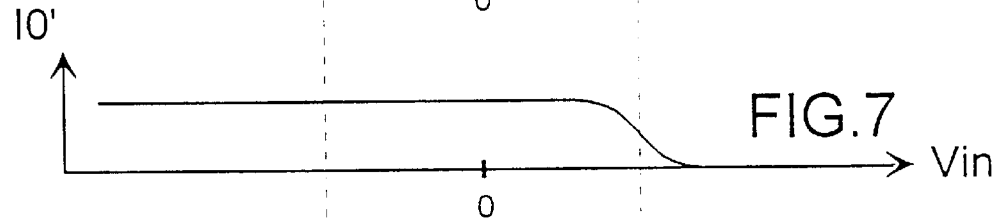
FIG. 7 is a characteristic curve describing the evolution of the second current added in a portion of the resistive load as a function of the input voltage of the amplifier.
Figure 8:
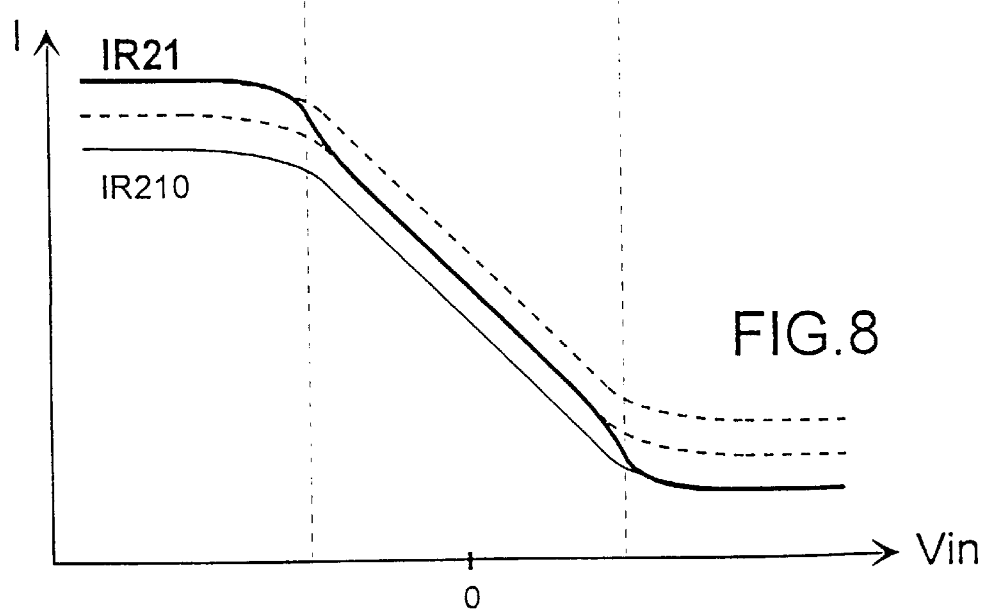
FIG. 8 is a set of characteristic curves describing the evolution of the current in said portion of the resistive load as a function of the input voltage of the amplifier.
Figure 9:
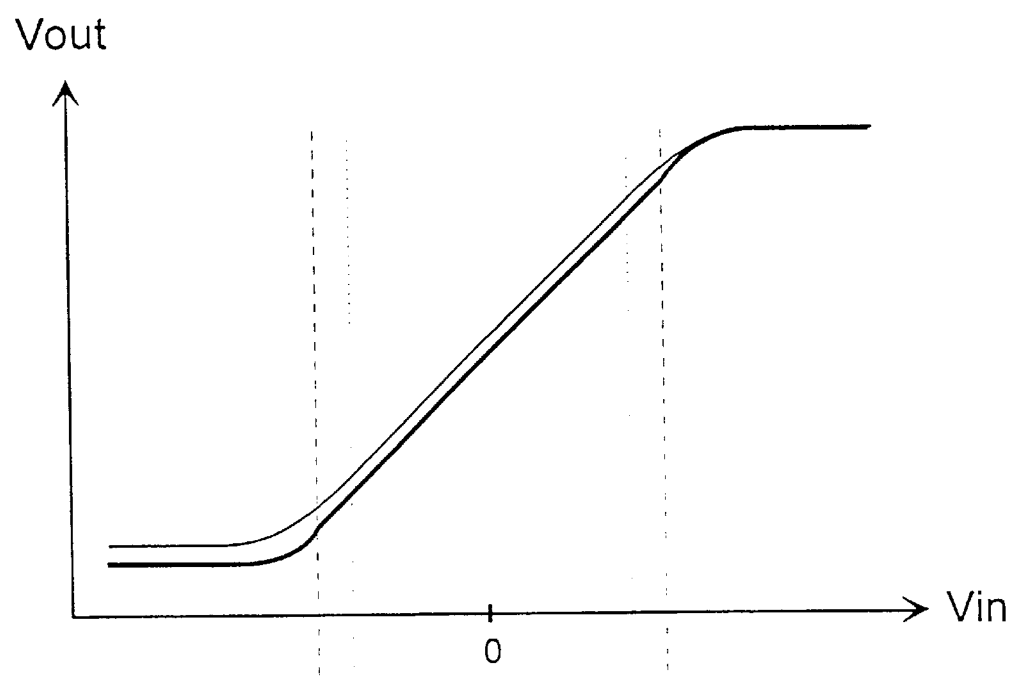
FIG. 9 is a characteristic curve describing the evolution of the output voltage as a function of the input voltage of the amplifier.

FIG. 5 shows the evolution of potentials VB, VC1, VD and VC2, as a function of the input voltage Vin of the amplifier AD. FIGS. 6 and 7 show the evolution of the first and second currents IO and IO', respectively, added in a portion of the resistive load, in this case R21, as a function of the input voltage Vin of the amplifier AD. FIG. 8 shows the evolution of the total current in said portion of the resistive load R21 as a function of the input voltage Vin of the amplifier AD. The curve IR210 illustrates the current which would flow in the second branch if the means 10 and 11 did not exist, i.e. in the case of a conventional differential pair. The broken-line curves illustrate the currents which would flow in the portion of the resistive load R21 if, in a first case, the maximum value of the current IO were added to the current IR210 and if, in a second case, the maximum value of the current IO' were added to the current previously obtained. FIG. 9 illustrates by way of the fat solid line the evolution of the output voltage Vout as a function of the input voltage Vin of an amplifier according to the invention, while the thin solid line illustrates the evolution of the output voltage of a conventional differential pair.

When Vin is negative and large in absolute value, transistor Q1 is hardly turned on, whereas the transistor Q2 is fully turned on. The current in the first branch is thus very low, whereas the current in the second branch is considerable. The voltage drops in the resistors R11 and R12 are negligible, whereas the voltage drops in the resistors R21 and R22 are significant. FIG. 5 shows that VCl is then substantially larger than VD. Transistor Q3 is thus hardly turned on, whereas transistor Q4 is fully turned on and causes a current IO to flow through resistor R21. As VB is substantially larger than VC2, transistor Q6 is hardly turned on, whereas transistor Q5 is fully turned on and causes an additional current IO' to flow through resistor R21. The total current IR21 flowing through resistor R21 is illustrated in FIG. 8. As the current flowing in the second branch has its maximum level, the output voltage is at its lowest level, as is shown in FIG. 9, and the additional voltage drop generated in R21 by the added currents IO and IO' explains the difference of value between the low level of the output voltage Vout of an amplifier according to the invention and that of the output voltage of the conventional differential pair.

When Vin increases, while staying negative, the first zone of non-linear operation of the conventional amplifier stage is reached: transistor Q1 conducts to a larger extent whereas transistor Q2 conducts to a smaller extent, while the current flowing in the first branch increases and the current flowing in the second branch decreases. The potentials VC1 and VD approach each other, thus increasing the conduction of Q3 and decreasing the conduction of Q4, and causing the progressive elimination of the current 10 flowing through the resistor R21.

All along the linear portion, which corresponds to the change of sign of Vin, transistor Q6 remains slightly conducting, whereas transistor Q5 remains very conducting and maintains the flow of the current IO' through resistor R21.

When Vin increases, the second zone of non-linear operation of the conventional amplifier stage is reached: transistor Q1 then conducts even more, whereas transistor Q2 conducts even less and the current flowing in the first branch increases, whereas the current flowing in the second branch decreases. The potentials VC2 and VB approach each other, thus increasing the conduction of Q6 and decreasing the conduction of Q5, and causing the progressive elimination of the current IO' flowing through the resistor R21.

When Vin has a large value, transistor Q2 conducts to a very small extent whereas transistor Q1 conducts to a very large extent. The current in the second branch is thus very low, whereas the current in the first branch is considerable. The voltage drops in the resistors R21 and R22 are negligible, whereas the voltage drops in the resistors R11 and R12 are significant. As the current flowing in the second branch is almost zero, the output voltage Vout is then at its highest level, as is shown in FIG. 9.

This figure shows the influence of the additional pairs of transistors in the non-linear zones of the characteristic curve of output voltage Vout. In the first non-linear zone, where Vout increases too early with Vin in the case of the conventional differential pair, the addition of the currents IO and IO' artificially maintains Vout at the low level for a longer time and subsequently the progressive decrease of IO allows Vout to increase quasi-linearly. Similarly, in the second non-linear zone, where Vout increases too slowly with Vin in the case of the conventional differential pair, the addition of the current IO' artificially maintains Vout at an intermediate level for a longer time and subsequently the progressive decrease of IO' allows Vout to increase quasi-linearly.

Figure 10:
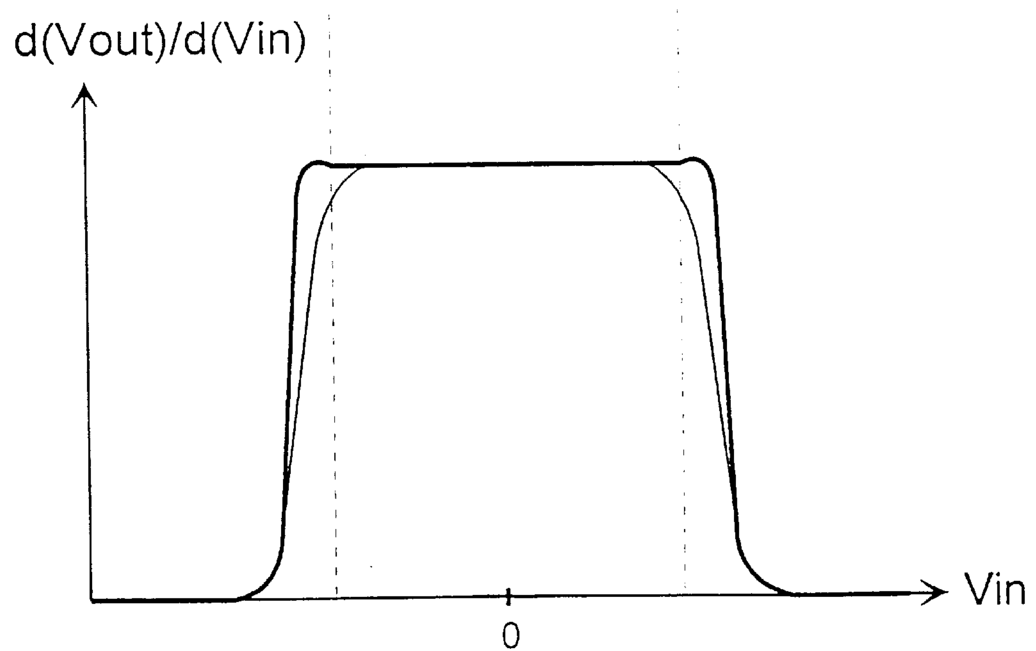
FIG. 10 is a characteristic curve describing the evolution of the derivative of the output voltage as a function of the derivative of the input voltage of the amplifier.

In this way, the zone where the output voltage evolves linearly as a function of the input voltage is enlarged. This result can be seen in FIG. 10, which shows two characteristic curves d(Vin)/d(Vout), as a function of the input voltage Vin, the thin solid-line curve corresponding to a conventional differential pair and the fat solid-line curve corresponding to an amplifier according to the invention. The "flat" part, where the derivative of the output voltage Vout with respect to the input voltage Vin is constant, corresponds to the part where the output voltage evolves linearly as a function of the input voltage. The zone thus defined is clearly larger for a voltage amplifier according to the invention than for a conventional differential pair.

Figure 11:
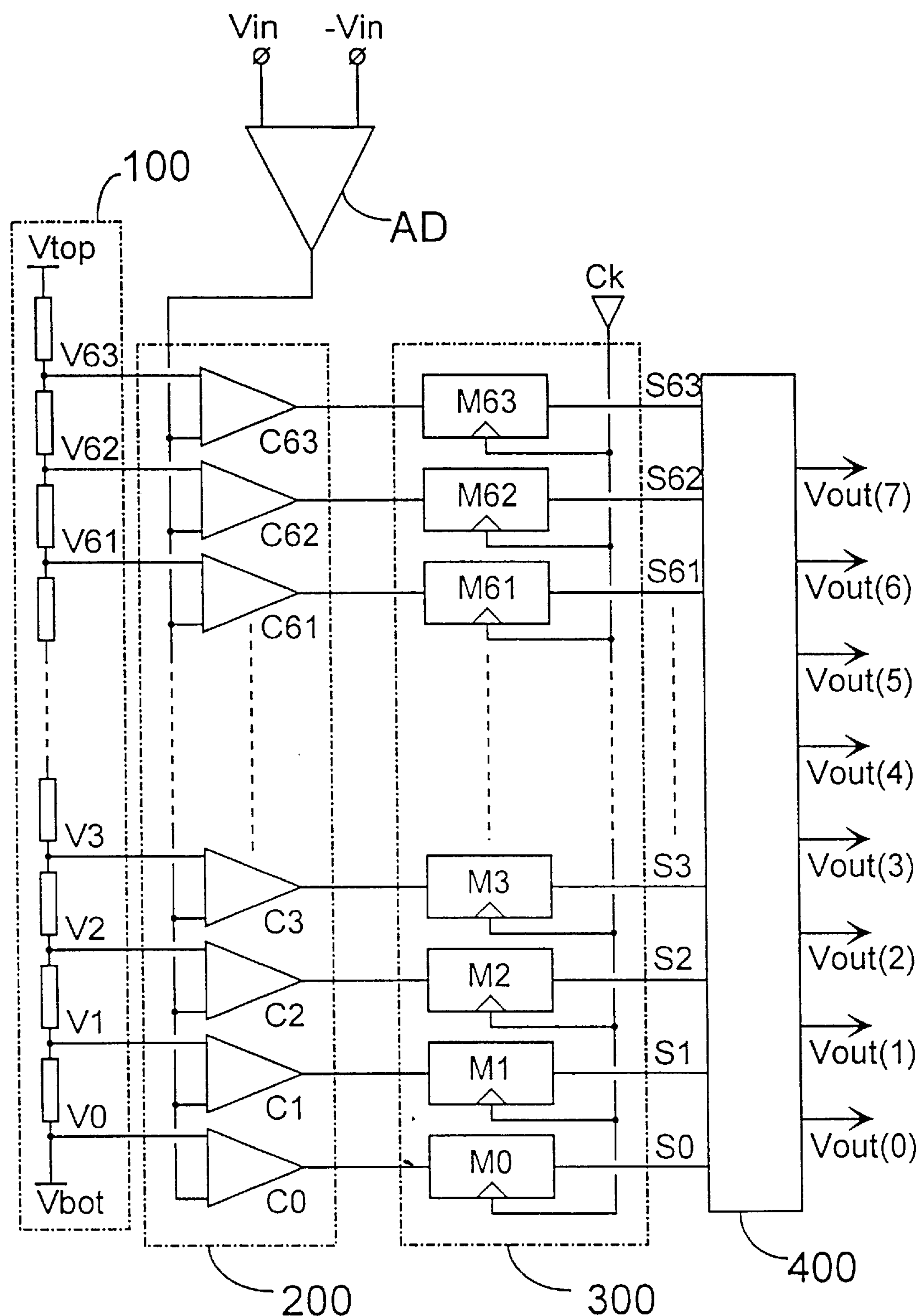
FIG. 11 is a partial functional circuit diagram of an A/D converter comprising a voltage amplifier according to the invention.

FIG. 11 shows partly an A/D converter which comprises a voltage amplifier AD in accordance with one of the variants shown in FIGS. 1, 2, 3 and 4. In the present case, this converter receives an analog input voltage of a differential nature (Vin, Vin) to be converted into an 8-bit digital output signal Vout(0 . . . 7). This converter comprises:

- the input amplifier AD receiving the analog input voltage (Vin, −Vin), and supplying an analog output voltage,
- a resistance ladder 100 consisting of 64 resistors arranged in series between a positive and a negative power supply terminal Vtop and Vbot, respectively, which resistors supply 64 reference voltages V0, V1, . . . V63, V0 being equal to Vbot, at their intermediate nodes,
- a comparator stage 200 consisting of 64 comparators each performing a comparison between the output voltage of the differential input amplifier AD and one of the reference voltages V0, V1, . . . , V63,
- a memory stage 300 consisting of storage elements referred to as memory cells MO, M1, . . . M63, each memory cell Mi (for i=0 to 63) having a data input, an output and a clock input and receiving, at its data input, an output signal Ci from a comparator, all the memory cells MO, M1, . . . M63 constituting the memory stage 300 and receiving, at their clock inputs, a same signal CK referred to as clock signal, and
- a binary encoder 400 having an input which receives the output signals S0, S1, . . . S63 fron the memory stage 300 and supplies the digital output signal Vout(0 . . . 7) of the converter.

What is claimed is:

1. A voltage amplifier intended to receive an input voltage and to supply an output voltage, which voltage amplifier comprises an amplifier stage including a first and a second transistor arranged as a differential pair, the base of the first transistor being intended to receive the input voltage, the base of the second transistor being intended to receive a voltage opposed to said input voltage, the collector of the first transistor being connected to a positive power supply terminal by means of a first branch comprising a resistive load, the collector of the second transistor, intended to supply the output voltage, being connected to the positive power supply terminal by means of a second branch comprising a resistive load, characterized in that the first branch is constituted by at least two series-arranged resistive elements featuring at least a first intermediate node between the positive power supply terminal and the collector of the first transistor, in that the second branch is constituted by at least two series-arranged resistive elements featuring at least a second intermediate node between the positive power supply terminal and the collector of the second transistor, in that the voltage amplifier is provided with means for comparing the potential of the second intermediate node with that of the collector of the first transistor, on the one hand, and the potential of the first intermediate node with that of the collector of the second transistor, on the other hand, and for adding, to the current supplied in a portion of the resistive load of the second branch, a first current which is progressively reduced to zero when the potential of the second intermediate node exceeds that of the collector of the first transistor, and a second current which is progressively reduced to zero when the potential of the collector of the second transistor exceeds that of the first intermediate node.

2. A voltage amplifier as claimed in claim 1, characterized in that the means for comparing the potential of the second intermediate node with that of the collector of the first transistor, on the one hand, and the potential of the first intermediate node with that of the collector of the second transistor, on the other hand, respectively comprise a third and a fourth transistor arranged as a differential pair, and a fifth and a sixth transistor arranged as a differential pair, the base of the third transistor being connected to the second intermediate node and that of the fourth transistor being connected to the collector of the first transistor, the base of the fifth transistor being connected to the first intermediate node and that of the sixth transistor being connected to the collector of the second transistor, the collectors of the fourth and the fifth transistor being connected to the second intermediate node.

3. A voltage amplifier intended to receive an input voltage and to supply an output voltage, which voltage amplifier comprises an amplifier stage including a first and a second transistor arranged as a differential pair, the base of the first transistor being intended to receive the input voltage, the base of the second transistor being intended to receive a voltage opposed to said input voltage, the collector of the first transistor being connected to a positive power supply terminal by means of a first branch comprising a resistive load, the collector of the second transistor, intended to supply the output voltage, being connected to the same positive power supply terminal by means of a second branch comprising a resistive load, characterized in that the first branch is constituted by at least three series-arranged resistive elements featuring at least a first and a second intermediate node between the positive power supply terminal and the collector of the first transistor, in that the second branch is constituted by at least three series-arranged resistive elements featuring at least a third and a fourth intermediate node between the positive power supply terminal and the collector of the second transistor, in that the voltage amplifier is provided with means for comparing the potentials of the collector of the first transistor and the fourth intermediate node, on the one hand, and those of the collector of the second transistor and the second intermediate node, on the other hand, and for adding to the current supplied in a portion of the resistive load of the second branch, a first current which is progressively reduced to zero when the potential of the fourth intermediate node exceeds that of the collector of the first transistor, and a second current which is progressively reduced to zero when the potential of the collector of the second transistor exceeds that of the second intermediate node.

4. A voltage amplifier as claimed in claim 3, characterized in that the means for comparing the potentials of the collector of the first transistor and the fourth intermediate node, on the one hand, and the potentials of the collector of the second transistor and the second intermediate node, on the other hand, respectively comprise a third and a fourth transistor arranged as a differential pair, and a fifth and a sixth transistor arranged as a differential pair, the base of the third transistor being connected to the fourth intermediate node and that of the fourth transistor being connected to the collector of the first transistor, the base of the fifth transistor being connected to the second intermediate node and that of the sixth transistor being connected to the collector of the second transistor, the collectors of the fourth and the fifth transistor being connected to one of the intermediate nodes of the second branch.

5. A voltage amplifier as claimed in claim 4, characterized in that the collectors of the fourth and the fifth transistor are connected to the third intermediate node.

6. A voltage amplifier as claimed in claim 5, characterized in that the resistive elements between the first and the second intermediate nodes, on the one hand, and between the third and the fourth intermediate nodes, on the other hand, have a same value R, in that the resistive elements between the positive power supply terminal and the first intermediate node, on the one hand, and between the positive power supply terminal and the third intermediate node, on the other hand, have a same value which is smaller than R, and in that the resistive elements between the second intermediate node and the collector of the first transistor, on the one hand, and between the fourth intermediate node and the collector of the second transistor, on the other hand, have a same value which is smaller than R.

7. A voltage amplifier as claimed in claim 5, characterized in that the resistive elements between the first and second intermediate nodes, on the one hand, and between the third and fourth intermediate nodes, on the other hand, have a same value R, in that the resistive elements between the positive power supply terminal and the first intermediate node and between the second intermediate node and the collector of the first transistor, as well as those between the positive power supply terminal and the third intermediate node and between the fourth intermediate node and the collector of the second transistor have a same value which is smaller than R.

8. A voltage amplifier as claimed in claim 7, characterized in that the resistive elements constituting the load of the amplifier stage are resistors.

9. An A/D converter comprising a voltage amplifier as claimed in claim 1 and intended to receive an analog input voltage of a differential nature, to be converted into a digital output signal, comprising:

said voltage amplifier being an input amplifier intended to receive the analog input voltage, and to supply an analog output voltage, a resistance ladder arranged in series between a positive and a negative power supply terminal, in which the resistors are intended to supply a plurality of reference voltages at their intermediate nodes, a comparator stage in which each comparator is intended to perform a comparison between the output voltage of the input amplifier and one of the reference voltages;

a memory stage intended to store the results of said comparisons, and a binary encoder intended to receive the information stored in the memory stage and to supply the digital output signal of the converter.

10. A voltage amplifier as claimed in claim 3, characterized in that the resistive elements between the first and the second intermediate nodes, on the one hand, and between the third and the fourth intermediate nodes, on the other hand, have a same value R, in that the resistive elements between the positive power supply terminal and the first intermediate node, on the one hand, and between the positive power supply terminal and the third intermediate node, on the other hand, have a same value which is smaller than R, and in that the resistive elements between the second intermediate node and the collector of the first transistor, on the one hand, and between the fourth intermediate node and the collector of the second transistor, on the other hand, have a same value which is smaller than R.

11. A voltage amplifier as claimed in claim 4, characterized in that the resistive elements between the first and the second intermediate nodes, on the one hand, and between the third and the fourth intermediate nodes, on the other hand, have a same value R, in that the resistive elements between the positive power supply terminal and the first intermediate node, on the one hand, and between the positive power supply terminal and the third intermediate node, on the other hand, have a same value which is smaller than R, and in that the resistive elements between the second intermediate node and the collector of the first transistor, on the one hand, and between the fourth intermediate node and the collector of the second transistor, on the other hand, have a same value which is smaller than R.

12. A voltage amplifier as claimed in claim 3, characterized in that the resistive elements between the first and second intermediate nodes, on the one hand, and between the third and fourth intermediate nodes, on the other hand, have a same value R, in that the resistive elements between the positive power supply terminal and the first intermediate node and between the second intermediate node and the collector of the first transistor, as well as those between the positive power supply terminal and the third intermediate node and between the fourth intermediate node and the collector of the second transistor have a same value which is smaller than R.

13. A voltage amplifier as claimed in claim 4, characterized in that the resistive elements between the first and second intermediate nodes, on the one hand, and between the third and fourth intermediate nodes, on the other hand, have a same value R, in that the resistive elements between the positive power supply terminal and the first intermediate node and between the second intermediate node and the collector of the first transistor, as well as those between the positive power supply terminal and the third intermediate node and between the fourth intermediate node and the collector of the second transistor have a same value which is smaller than R.

14. An A/D converter comprising a voltage amplifier as claimed in claim 2 and intended to receive an analog input voltage of a differential nature, to be converted into a digital output signal, comprising:

said voltage amplifier being an input amplifier intended to receive the analog input voltage, and to supply an analog output voltage, a resistance ladder arranged in series between a positive and a negative power supply terminal, in which the resistors are intended to supply a plurality of reference voltages at their intermediate nodes, a comparator stage in which each comparator is intended to perform a comparison between the output voltage of the input amplifier and one of the reference voltages;

a memory stage intended to store the results of said comparisons, and a binary encoder intended to receive the information stored in the memory stage and to supply the digital output signal of the converter.

15. An A/D converter comprising a voltage amplifier as claimed in claim 3 and intended to receive an analog input voltage of a differential nature, to be converted into a digital output signal, comprising:

said voltage amplifier being an input amplifier intended to receive the analog input voltage, and to supply an analog output voltage, a resistance ladder arranged in series between a positive and a negative power supply terminal, in which the resistors are intended to supply a plurality of reference voltages at their intermediate nodes, a comparator stage in which each comparator is intended to perform a comparison between the output voltage of the input amplifier and one of the reference voltages;

a memory stage intended to store the results of said comparisons, and a binary encoder intended to receive the information stored in the memory stage and to supply the digital output signal of the converter.

16. An A/D converter comprising a voltage amplifier as claimed in claim 4 and intended to receive an analog input voltage of a differential nature, to be converted into a digital output signal, comprising:

said voltage amplifier being an input amplifier intended to receive the analog input voltage, and to supply an analog output voltage, a resistance ladder arranged in series between a positive and a negative power supply terminal, in which the resistors are intended to supply a plurality of reference voltages at their intermediate nodes, a comparator stage in which each comparator is intended to perform a comparison between the output voltage of the input amplifier and one of the reference voltages;

a memory stage intended to store the results of said comparisons, and a binary encoder intended to receive the information stored in the memory stage and to supply the digital output signal of the converter.

17. An A/D converter comprising a voltage amplifier as claimed in claim 5 and intended to receive an analog input voltage of a differential nature, to be converted into a digital output signal, comprising:

said voltage amplifier being an input amplifier intended to receive the analog input voltage, and to supply an analog output voltage, a resistance ladder arranged in series between a positive and a negative power supply terminal, in which the resistors are intended to supply a plurality of reference voltages at their intermediate nodes, a comparator stage in which each comparator is intended to perform a comparison between the output voltage of the input amplifier and one of the reference voltages;

a memory stage intended to store the results of said comparisons, and a binary encoder intended to receive the information stored in the memory stage and to supply the digital output signal of the converter.

18. An A/D converter comprising a voltage amplifier as claimed in claim 6 and intended to receive an analog input voltage of a differential nature, to be converted into a digital output signal, comprising:

said voltage amplifier being an input amplifier intended to receive the analog input voltage, and to supply an analog output voltage, a resistance ladder arranged in series between a positive and a negative power supply terminal, in which the resistors are intended to supply a plurality of reference voltages at their intermediate nodes, a comparator stage in which each comparator is intended to perform a comparison between the output voltage of the input amplifier and one of the reference voltages;

a memory stage intended to store the results of said comparisons, and a binary encoder intended to receive the information stored in the memory stage and to supply the digital output signal of the converter.

19. An A/D converter comprising a voltage amplifier as claimed in claim 7 and intended to receive an analog input voltage of a differential nature, to be converted into a digital output signal, comprising:

said voltage amplifier being an input amplifier intended to receive the analog input voltage, and to supply an analog output voltage, a resistance ladder arranged in series between a positive and a negative power supply terminal, in which the resistors are intended to supply a plurality of reference voltages at their intermediate nodes, a comparator stage in which each comparator is intended to perform a comparison between the output voltage of the input amplifier and one of the reference voltages;

a memory stage intended to store the results of said comparisons, and a binary encoder intended to receive the information stored in the memory stage and to supply the digital output signal of the converter.

20. An A/D converter comprising a voltage amplifier as claimed in claim 10 and intended to receive an analog input voltage of a differential nature, to be converted into a digital output signal, comprising:

said voltage amplifier being an input amplifier intended to receive the analog input voltage, and to supply an analog output voltage, a resistance ladder arranged in series between a positive and a negative power supply terminal, in which the resistors are intended to supply a plurality of reference voltages at their intermediate nodes, a comparator stage in which each comparator is intended to perform a comparison between the output voltage of the input amplifier and one of the reference voltages;

a memory stage intended to store the results of said comparisons, and a binary encoder intended to receive the information stored in the memory stage and to supply the digital output signal of the converter.

* * * * *